(12) United States Patent
Sakai et al.

(10) Patent No.: US 6,884,647 B2
(45) Date of Patent: Apr. 26, 2005

(54) METHOD FOR ROUGHENING SEMICONDUCTOR SURFACE

(75) Inventors: Shiro Sakai, 174-4 Nakatsu-ura, Hachiman-cho, Tokushima-shi, Tokushima 770-8072 (JP); Yves Lacroix, Tokushima (JP)

(73) Assignees: Shiro Sakai (JP); Nitride Semiconductors Co., Ltd. (JP)

( * ) Notice: Subject to any disclaimer, the term of this patent is extended or adjusted under 35 U.S.C. 154(b) by 383 days.

(21) Appl. No.: 10/102,863

(22) Filed: Mar. 21, 2002

(65) Prior Publication Data

US 2003/0181057 A1 Sep. 25, 2003

(51) Int. Cl.$^7$ .............................................. H01L 21/00
(52) U.S. Cl. ..................... 438/30; 438/712; 438/720
(58) Field of Search .......................... 438/22, 30, 46, 438/149, 151, 158, 706, 712, 720, 745, 150

(56) References Cited

U.S. PATENT DOCUMENTS

| | | | |
|---|---|---|---|
| 3,909,929 A | 10/1975 | Debesis | 29/590 |
| 4,985,113 A | 1/1991 | Fujimoto et al. | 156/643 |
| 5,332,697 A | 7/1994 | Smith et al. | 437/242 |
| 5,429,954 A * | 7/1995 | Gerner | 438/33 |
| 5,633,192 A * | 5/1997 | Moustakas et al. | 438/46 |
| 5,639,689 A | 6/1997 | Woo | |
| 5,652,438 A | 7/1997 | Sassa et al. | |
| 5,717,226 A | 2/1998 | Lee et al. | 257/86 |
| 5,767,581 A | 6/1998 | Nakamura et al. | 257/749 |
| 5,786,233 A | 7/1998 | Taskar et al. | 438/46 |

(Continued)

FOREIGN PATENT DOCUMENTS

| | | | |
|---|---|---|---|
| EP | 0 180 222 A2 | 5/1986 | H01L/31/18 |
| EP | 0 180 222 A3 | 5/1986 | H01L/21/308 |
| EP | 0 497 350 B2 | 8/1992 | C30B/25/02 |
| EP | 0 723 303 A2 | 7/1996 | H01L/33/00 |
| EP | 0 731 490 A2 | 9/1996 | H01L/21/033 |
| EP | 0 723 303 A3 | 5/1997 | H01L/33/00 |
| EP | 0 779 666 A2 | 6/1997 | H01L/23/00 |
| EP | 0 731 490 A3 | 3/1998 | H01L/21/033 |
| EP | 0 942 459 A1 | 9/1999 | H01L/21/205 |
| EP | 0 961 328 A2 | 12/1999 | H01L/33/00 |

(Continued)

OTHER PUBLICATIONS

English/Japanese Notice of Grounds For Rejection, Japanese Patent Application Serial No. 2000–227963, 7 pages.
English/Japanese Notice of Grounds for Rejection, Japanese Patent Application Serial No. 2000–164349, 4 pages.
Patent Abstract of Japanese Patent No. JP10312971, published Nov. 24, 1998, 1 page.
Patent Abstract of Japanese Patent No. JP2000021789, published Jan. 21, 2000, 1 page.
Patent Abstract of Japanese Patent No. JP11354839, published Dec. 24, 1999, 1 page.

(Continued)

*Primary Examiner*—Duy-Vu N. Deo
(74) *Attorney, Agent, or Firm*—Osha & May L.L.P.

(57) ABSTRACT

In order to provide a method for easily roughening a surface of a semiconductor constituting an LED, a first material 18 and a second material 20 having a property that they are nonuniformly mixed when thermally treated are deposited on a semiconductor 16, the structure is thermally treated, and etching is performed through reactive ion etching in which the etching rate with respect to the first material 18 is slower than the etching rates with respect to the second material 20 and to the semiconductor 16. During this process, a region 22 in which the first material 18 is the primary constituent functions as an etching mask, and a predetermined roughness can be easily formed on the surface of the semiconductor 16.

3 Claims, 3 Drawing Sheets

U.S. PATENT DOCUMENTS

| | | | | |
|---|---|---|---|---|
| 5,787,104 A | * | 7/1998 | Kamiyama et al. | 372/43 |
| 5,804,918 A | | 9/1998 | Yazawa et al. | 313/506 |
| 5,874,747 A | | 2/1999 | Redwing et al. | 257/77 |
| 5,880,485 A | | 3/1999 | Marx et al. | 257/94 |
| 5,888,886 A | | 3/1999 | Sverdlov et al. | 438/505 |
| 5,900,650 A | | 5/1999 | Nitta | 257/94 |
| 5,929,466 A | | 7/1999 | Ohba et al. | 257/103 |
| 6,030,848 A | | 2/2000 | Yuge et al. | 438/46 |
| 6,090,666 A | | 7/2000 | Ueda et al. | 438/257 |
| 6,103,604 A | | 8/2000 | Bruno et al. | 438/584 |
| 6,172,382 B1 | | 1/2001 | Nagahama et al. | 257/94 |
| 6,177,684 B1 | | 1/2001 | Sugiyama | 257/17 |
| 6,191,436 B1 | | 2/2001 | Shibata et al. | 257/91 |
| 6,242,328 B1 | | 6/2001 | Shin | 438/518 |
| 6,261,862 B1 | | 7/2001 | Hori et al. | 438/96 |
| 6,277,665 B1 | * | 8/2001 | Ma et al. | 438/46 |
| 6,355,945 B1 | | 3/2002 | Kadota et al. | 257/82 |
| 6,423,984 B1 | | 7/2002 | Kato et al. | 257/103 |
| 6,429,102 B1 | | 8/2002 | Tsai et al. | 438/508 |
| 6,455,337 B1 | | 9/2002 | Sverdlov | 438/22 |
| 6,465,808 B1 | | 10/2002 | Lin | 257/81 |
| 2002/0036286 A1 | | 3/2002 | Ho et al. | 257/11 |
| 2002/0042159 A1 | | 4/2002 | Chiyo et al. | 438/46 |
| 2002/0043890 A1 | | 4/2002 | Lu et al. | 310/313 D |
| 2003/0178634 A1 | | 9/2003 | Koide | 257/103 |
| 2004/0026704 A1 | * | 2/2004 | Nikolaev et al. | 257/82 |
| 2004/0051105 A1 | * | 3/2004 | Tsuda et al. | 257/79 |

FOREIGN PATENT DOCUMENTS

| | | | |
|---|---|---|---|
| JP | 60-188465 | 9/1985 | |
| JP | 1-119049 | 5/1989 | |
| JP | 4-297023 | 10/1992 | H01L/21/205 |
| JP | 4-288871 | 8/1993 | H01L/21/469 |
| JP | 6-291366 | 10/1994 | H01L/33/00 |
| JP | 407263408 A | 10/1995 | H01L/21/3065 |
| JP | 9-17975 | 1/1997 | H01L/27/108 |
| JP | 9-227298 | 9/1997 | C30B/29/38 |
| JP | 10-22568 | 1/1998 | H01S/3/18 |
| JP | 10-163525 | 6/1998 | H01L/33/00 |
| JP | 10-312971 | 11/1998 | H01L/21/205 |
| JP | 10-321913 | 12/1998 | H01L/33/00 |
| JP | 11-111867 | 4/1999 | H01L/21/8247 |
| JP | 11-135832 | 5/1999 | H01L/33/00 |
| JP | 11-145057 | 5/1999 | H01L/21/20 |
| JP | 11-145516 | 5/1999 | H01L/33/00 |
| JP | 11-266004 | 9/1999 | H01L/29/06 |
| JP | 11-346032 | 12/1999 | H01S/3/18 |
| JP | 11-346035 | 12/1999 | H01S/3/18 |
| JP | 11-354839 | 12/1999 | H01L/33/00 |
| JP | 11-354840 | 12/1999 | H01L/33/00 |
| JP | 11-354842 | 12/1999 | H01L/33/00 |
| JP | 2000-21789 | 1/2000 | H01L/21/205 |
| JP | 2000-91252 | 3/2000 | H01L/21/205 |
| JP | 2000-91253 | 3/2000 | H01L/21/205 |
| JP | 2000-174344 | 6/2000 | H01L/33/00 |
| JP | 2000-357820 | 12/2000 | H01L/33/00 |
| KR | 0127688 | 12/1993 | |
| WO | WO98/42030 | 9/1998 | H01L/33/00 |
| WO | WO98/44569 | 10/1998 | H01L/33/00 |

OTHER PUBLICATIONS

Patent Abstract of Japanese Patent No. JP11354840, published Dec. 24, 1999, 1 page.
Patent Abstract of Japanese Patent No. JP11354842, published Dec. 24, 1999, 1 page.
Patent Abstract of Japanese Patent No. JP11266004 corresponding to US Patent No. 6,177,684, published Jan. 23, 2001, 1 page.
Patent Abstracts of Japan, Publication No. 09227298A, published Sep. 2, 1977, 1 page.
Patent Abstracts of Japan, Publication No. 10022568A, published Jan. 23, 1998, 1 page.
Patent Abstracts of Japan, Publication No. 11135832A, published May 21, 1999, 1 page.
Patent Abstracts of Japan, Publication No. 11145057A, published May 28, 1999, 1 page.
Patent Abstracts of Japan, Publication No. 11145516A, published May 28, 1999, 1 page.
Patent Abstracts of Japan, Publication No. 11346032A, published Dec. 14, 1999, 1 page.
Patent Abstracts of Japan, Publication No. 11346035A, published Dec. 14, 1999, 1 page.
Patent Abstracts of Japan, Publication No. 2000091252A, published Mar. 31, 2000, 1 page.
Patent Abstracts of Japan, Publication No. 2000091253A, published May 31, 2000, 1 page.
Patent Abstracts of Japan, Publication No. 2000357820A, published Dec. 26, 2000, 1 page.
Patent Abstract of Japanese Patent No. JP4297023 corresponding to European Patent No. EP0497350, published Aug. 5, 1992, 1 page.
"InGan/GaN/AlGaN–based laser diodes with modulation–doped strained–layer superlattices grown on an epitaxially laterally overgrown GaN substrate", Shuji Nakamura et al. Appl. Phys. Lett. 72 (2), Jan. 12, 1988, 1998 American Insitute of Physics, 3 pages.
"Influence of sapphire nitridation on properties of gallium nitride grown by metalorganic chemical vapor deposition", S. Keller et al. Appl. Phys. Lett. 68 (11), Mar. 11, 1996, 1996 American Institute of Physics, 3 pages.
"The effect of the Si/N treatment of a nitridated sapphire surface on the growth mode of GaN in low–pressure metalorganic vapor phase epitaxy", S. Haffouz et al. Applied Physics Letters, vol. 73, No. 9, Aug. 31, 1998, 3 pages.
"Growth of high–quality GaN by low–pressure metal–organic vapour phase epitaxy (LP–MOVPE) from 3D islands and lateral overgrowth", H. Lahreche et al. N.H Elsevier Journal of Crystal Growth 205 (1999) 245–252, 8 pages.
"Optimization of Si/N Treatment Time of Sapphire Surface and Its Effect on the MOVPE GaN Overlayers", S. Haffouz et al. phys. stat. sol. (a) 176, 677 (1999), 5 pages.
"Influence of in situ sapphire surface preparation and carrier gas on the growth mode of GaN in MOVPE" P. Vennegues et al. N.H. Elsevier Journal of Crystal Growth 187 (1998) 167–177, 11 pages.
Excerpt from the Workbook of "The Tenth International Conference on Metalorganic Vapor Phase Epitaxy" Hokkaido University Jun. 5–9, 2000, 5 pages.
Patent Abstracts of Japan, Publication No. 07097300, Publication Date Apr. 11, 1995, 1 page.
Patent Abstracts of Japan, Publication No. 10178213, Publication Date Jun. 30, 1998, 1 page.
Patent Abstracts of Japan, Publication No. 10242061, Publication Date Aug. 11, 1998, 1 page.
Patent Abstracts of Japan, Publication No. 11186174, Publication Date Jul. 9, 1999, 1 page.
Patent Abstracts of Japan, Publication No. 11274557, Publication Date Oct. 8, 1999, 1 page.
Patent Abstracts of Japan, Publication No. 2000306854, Publication Date Nov. 2, 2000, 1 page.
European Search Report dated Nov. 11, 2002, 4 pages.
European Search Report dated Jan. 8, 2003, 3 pages.

Japanese Patent Application Serial No. 091100294 Office Action dated Mar. 14, 2003.

Japanese Patent Application Serial No. 2000–289103 Office Action dated Apr. 22, 2003.

Patent Abstracts of Japan, Publication No. 11111867, Publication Date Apr. 23, 1999, 1 page.

S. Sakai et al., "A New Method of Reducing Dislocation Density in GaN Layer Grown on Sapphire Substrate by MOVPE", Journal of Crystal Growth 221 (2000) pp. 334–337.

Kikuo Tominaga, et al., "Preparation of Conductive ZnO: Al Films by a Facing Target System with a Strong Magnectic Field", Thin Solid Films, 253 (1994) pp. 9–13.

Matthew Joseph, et al., "P–Type Electrical Conduction in ZnO Thin Films by Ga and N Codoping", Jpn. J. Appl. Phys. vol. 38 (1999) pp. L1205–L1207.

Japanese Patent Application Serial No. 2000–358412 Office Action dated May 27, 2003.

U.S. Appl. No. 10/139,863, Office Action Dated May 23, 2003.

Office Action mailed May 25, 2004 for Patent Application Serial No. 10–2002–0015004.

ESP@CENET Document Bibliography and Abstract for JP1119049.

Abstract of Japanese Publication No. 60–188465 (1 page).

European Search Report dated Nov. 27, 2003 (4 pages).

* cited by examiner

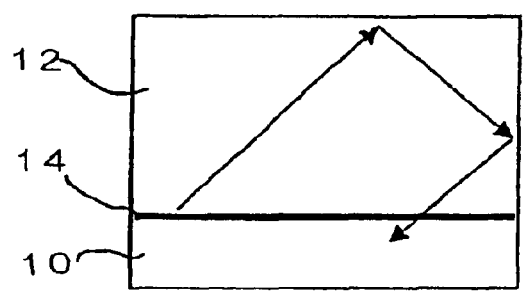
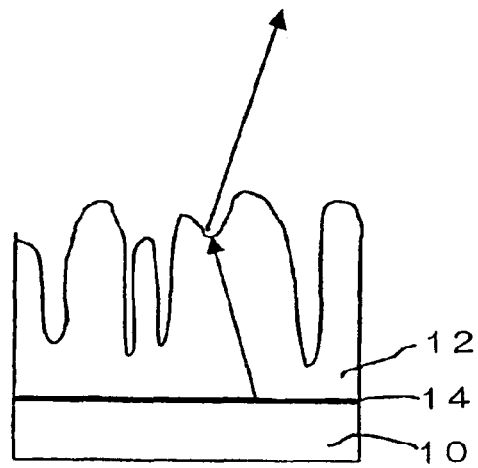
FIG. 1(a)
(Prior Art)
FIG. 1(b)
(Prior Art)

METHOD FOR ROUGHENING SEMICONDUCTOR SURFACE

BACKGROUND OF THE INVENTION

1. Field of the Invention

The present invention relates to an improvement in a method for roughening a surface of a semiconductor, in particular, a gallium nitride semiconductor.

2. Description of the Related Art

In a light emitting diode (LED), a PN junction 14 formed from an N type layer 10 and a P type layer 12 is used as the light emitting section, as shown in FIG. 1(a). The light emitted from the light emitting section is extracted for use in various applications. In such an LED, the surface of the element is usually formed flat. When the surface of the LED is flat, a large portion of the light emitted from the PN junction 14 is reflected at the surface of the LED, as shown in FIG. 1(a), and is not emitted to the outside. Because of this, there had been a problem in that the light extraction efficiency cannot be increased.

In order to solve this problem, it is effective to roughen the surface for extracting light of the semiconductor which constitutes the LED, as shown in FIG. 1(b). When a surface of the semiconductor constituting the LED is roughened, reflection, at the light extraction surface of the semiconductor, of the light generated at the PN junction 14 back to the inside of LED when the light reaches the light extraction surface can be avoided, as shown in FIG. 1(b). This facilitates extraction of light to the outside of the LED and the light extraction efficiency of the LED can be improved.

Moreover, when the surface of the semiconductor constituting the LED is roughened, the surface area is significantly increased compared to a flat surface. This facilitates ohmic contact and thus, formation of an electrode.

However, conventionally, there had been no method for easily roughening the surface of the semiconductor constituting the LED.

SUMMARY OF THE INVENTION

The present invention was conceived to solve the above problem and one object of the present invention is to provide a method for easily roughening a surface of a semiconductor constituting an LED.

In order to achieve at least the object mentioned above, according to the present invention, there is provided a method for roughening a surface of a semiconductor comprising the steps of depositing, on a surface of a semiconductor, a first material and a second material having a property that when thermally treated, the first and second materials are nonuniformly mixed; thermally treating the semiconductor onto which the two materials are deposited; and etching the surface of the semiconductor onto which the two materials are deposited through an etching method in which the etching rate of the first material is slower than the etching rates of the second material and of the material for the semiconductor.

According to another aspect of the present invention, it is preferable that in the method for roughening the surface of a semiconductor, the first and second materials are evaporated as layers onto the surface of the semiconductor through vacuum evaporation.

According to another aspect of the present invention, it is preferable that in the method for roughening the surface of a semiconductor, the semiconductor is a gallium nitride semiconductor, the first material is Ni, the second material is Au, and the etching method is reactive ion etching.

With the above structures, two materials deposited on the semiconductor surface are nonuniformly mixed, and because the etching rate of the first material is slower than the etching rates of the second material and of the semiconductor, the first material functions as an etching mask so that unevenness can be created on the semiconductor surface.

BRIEF DESCRIPTION OF THE DRAWINGS

FIGS. 1(a) and 1(b) are diagrams for explaining how the light is extracted from a light emitting diode in the prior art.

DESCRIPTION OF PREFERRED EMBODIMENT

Figures 2A, 2B, 2C, 2D, 2E:
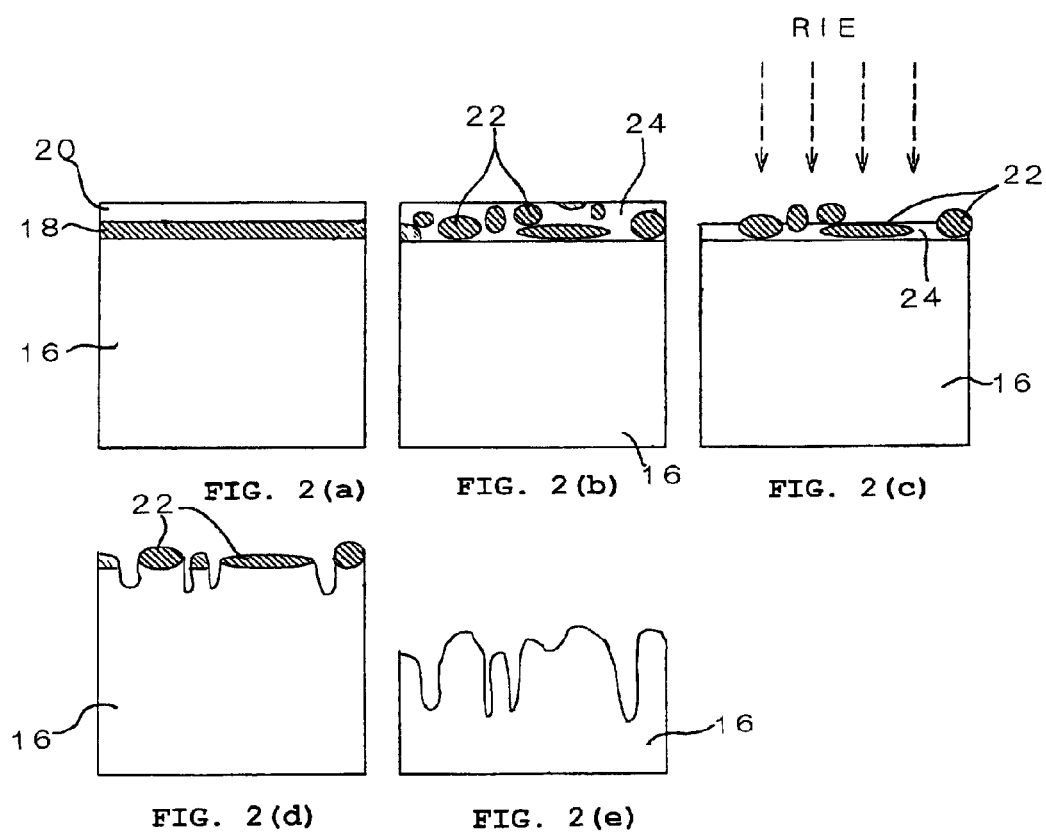
FIGS. 2(a)–2(e) are diagrams for explaining the steps for a method for roughening a surface of a semiconductor according to the present invention.

A preferred embodiment of the present invention will now be described referring to the drawings.

FIGS. 2(a) through 2(e) show the steps for a method for roughening a surface of a semiconductor according to the present invention. As shown in FIG. 2(a), a first material 18 and a second material 20 are deposited on a surface of a semiconductor 16 which constitutes an LED. The first material 18 and second material 20 are materials that have a property such that when these materials are thermally treated, they melt into each other to form a nonuniform mixture state. For example, when nickel (Ni) is used as the first material 18 and gold (Au) is used as the second material 20, the materials mix with each other when thermally treated, but the mixing is nonuniform. Because of this, by thermally treating the semiconductor 16 onto which the two materials 18 and 20 are deposited, a region 22 where the composition of Ni which is the first material 18 is large can be formed as spots in a region 24 where the composition of Au which is the second material 20 is large.

In order to deposit the first material 18 and the second material 20 on the surface of the semiconductor 16, for example, vacuum evaporation can be employed to deposit the first material 18 and the second material 20 as layers on the surface of the semiconductor 16. However, the method for depositing the two materials 18 and 20 is not limited to the above vacuum evaporation and any deposition method can be employed that allows the first material and the second material to nonuniformly mix when the structure is thermally treated.

Next, as shown in FIG. 2(c), the surface of the semiconductor 16 onto which the first material 18 and the second material 20 are deposited is etched through an etching method in which the etching rate of the first material 18 is slower than the etching rates of the second material 20 and of the semiconductor 16. For example, when Ni is used as the first material 18, Au is used as the second material 20, and gallium nitride (GaN) is used as the material for the semiconductor 16 as described above, reactive ion etching (RIE) can be employed as the etching method in order to selectively etch as above.

Figure 3A:
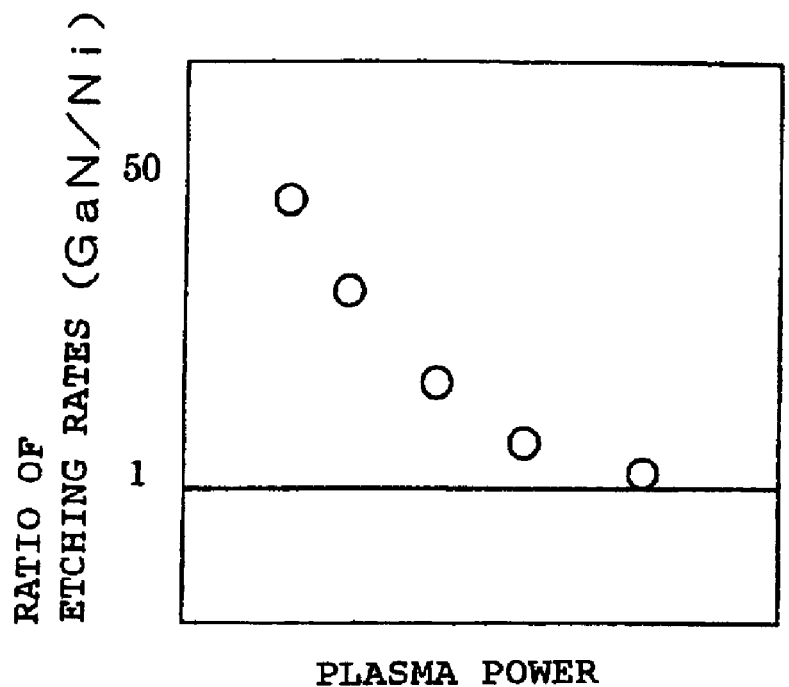
FIG. 3(a) is a diagram showing the relationship between the ratio of etching rates of GaN and Ni and plasma power.
Figure 3B:
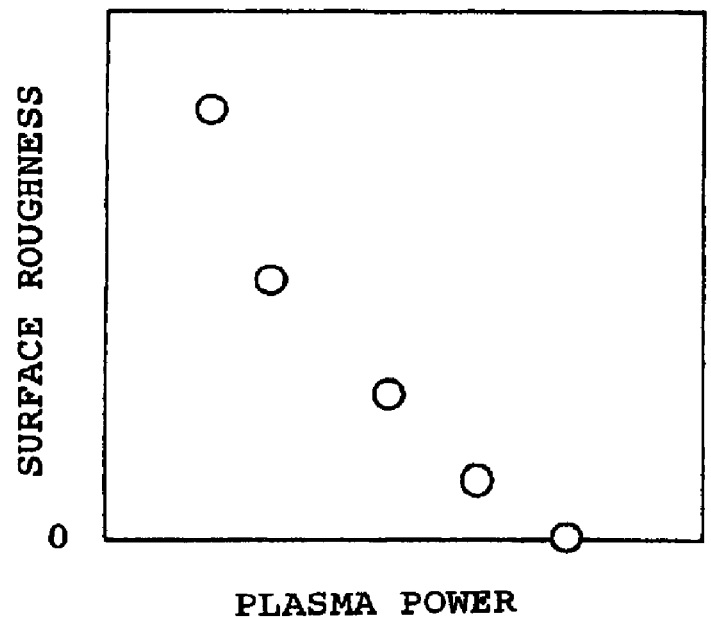
FIG. 3(b) is a diagram showing the relationship between the surface roughness and plasma power.

FIG. 3(a) shows the relationship between a ratio of the etching rates of GaN and Ni and the plasma power to be applied, when the structure is etched in an RIE device. FIG. 3(*b*) shows the relationship between the roughness of the surface of the semiconductor (GaN) and the plasma power in such a case. As is clear from FIGS. 3(*a*) and 3(*b*), when the applied plasma power is small, GaN is selectively etched and Ni is not etched, and therefore, the surface roughness of GaN is high. Although not shown in the figures, the etching rate in RIE of Au which is the second material is larger than those of GaN and Ni.

In this manner, when the above combination of materials are used and RIE is employed as the etching method, Ni which is the primary constituent of the region 22 where the composition of the first material is large functions as an etching mask, and Au which is the primary constituent of the region 24 where the composition of the second material is large and GaN which is the material for the semiconductor 16 are selectively etched, as shown in FIG. 2 (d). Therefore, if the etching process is performed for a predetermined period of time, a predetermined unevenness of the surface of GaN which is the material for the semiconductor 16 is formed, as shown in FIG. 2(*e*).

In the above discussion, Ni is used as the first material 18 and Au is used as the second material 20, but the materials are not limited to these. In other words, any combination of materials can be used as long as the etching rates for RIE differ significantly and the materials can be nonuniformly mixed by thermal treatment.

As described, according to the present invention, two materials that mix nonuniformly when thermally treated are deposited on a surface of a semiconductor, the structure is thermally treated, and then etching process is performed by a method which can selectively etch one of the materials and the semiconductor. Through this process, the surface of the semiconductor can easily be roughened.

What is claimed is:

1. A method for roughening a surface of a semiconductor comprising the steps of:

depositing, on a surface of a semiconductor, a first material and a second material having a property that when thermally treated, the first and second materials are nonuniformly mixed;

thermally treating the semiconductor onto which the two materials are deposited; and etching the surface of the semiconductor onto which the two materials are deposited through an etching method in which the etching rate of the first material is slower than the etching rates of the second material and of the surface of the semiconductor.

2. A method for roughening a surface of a semiconductor according to claim 1, wherein the first and second materials are evaporated as layers onto the surface of the semiconductor through vacuum evaporation.

3. A method for roughening a surface of a semiconductor according to claim 1, wherein the semiconductor is a gallium nitride semiconductor, the first material is Ni, the second material is Au, and the etching method is reactive ion etching.

* * * * *